US006813646B2

United States Patent
Boswell et al.

(10) Patent No.: US 6,813,646 B2
(45) Date of Patent: Nov. 2, 2004

(54) CONTROLLING ELECTRONICS ACROSS AN RF BARRIER USING A SERIAL INTERFACE BUS

(75) Inventors: Bryan D. Boswell, Loveland, CO (US); Richard E. Warren, Loveland, CO (US); Gregory E. Brandes, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 222 days.

(21) Appl. No.: 10/001,436

(22) Filed: Oct. 31, 2001

(65) Prior Publication Data

US 2003/0082959 A1 May 1, 2003

(51) Int. Cl.[7] .................................................. G06F 3/00
(52) U.S. Cl. .............................................. 710/3; 710/5
(58) Field of Search ........................ 710/3, 5; 439/610; 361/816, 687; 345/163

(56) References Cited

U.S. PATENT DOCUMENTS

| | | | | |
|---|---|---|---|---|
| 5,244,415 A | * | 9/1993 | Marsilio et al. | ............ 439/610 |
| 5,383,096 A | * | 1/1995 | Benson et al. | ............. 361/816 |
| 5,953,206 A | * | 9/1999 | Jondrow | ..................... 361/687 |
| 6,307,538 B1 | * | 10/2001 | Bacon | ........................ 345/163 |

* cited by examiner

*Primary Examiner*—Jeffrey Gaffin
*Assistant Examiner*—Harold Kim

(57) ABSTRACT

A method for controlling electronics across an RF barrier is disclosed. The method comprises a serial data control method that requires a limited number of signals passing through an RF barrier and does not require a free running clock. This method uses a processor with an associated serial data control bus that is located external to the RF chamber. An address dependent form of the serial bus passes through an interface to the RF cavity. The processor uses the serial bus to control electronics inside the RF cavity. The control method uses a minimum number of signals passing through the interface to the RF cavity, thereby preserving the RF isolation of the RF cavity from the external environment.

18 Claims, 2 Drawing Sheets

| LINE #1 | LINE #2 | LINE #3 | ADDRESS | COMMENTS |
|---|---|---|---|---|
| 0 | 0 | 0 | 0 | RESERVED |
| 0 | 0 | 1 | 1 | INTERNAL ELECTRONICS 1 |
| 0 | 1 | 0 | 2 | INTERNAL ELECTRONICS 2 |
| 0 | 1 | 1 | 3 | INTERNAL ELECTRONICS 3 |
| 1 | 0 | 0 | 4 | EXTERNAL ELECTRONICS 1 |
| 1 | 0 | 1 | 5 | EXTERNAL ELECTRONICS 2 |
| 1 | 1 | 0 | 6 | RESERVED |
| 1 | 1 | 1 | 7 | EXTERNAL ELECTRONICS 3 |

FIG. 2

CONTROLLING ELECTRONICS ACROSS AN RF BARRIER USING A SERIAL INTERFACE BUS

TECHNICAL FIELD

This invention relates generally to the field of radio frequency (RF) fixture devices, and more specifically to a method of controlling electronics across an RF barrier.

BACKGROUND OF THE INVENTION

RF enclosures may be used in a variety of test and measurement applications when the amount of RF radiation that impacts a device under test (DUT) must be carefully controlled. Specific examples include prototype testing and production testing of cellular telephones, portable computers, pagers, and other small electronic devices. Often RF enclosures are used in automated or semi-automated environments in which machines are used to place the DUT inside the RF enclosure. In these types of test environments, it is desirable to be able to evaluate the functionality and correct operation of the DUT while the DUT is within the RF enclosure. The use of electronics circuitry and software may be used to apply specific test resources to the DUT and measure the responses. In most applications, the electronics circuitry and software is located both internal and external to the RF enclosure. However, placing high speed electronics within the RF enclosure reduces the RF isolation and generates spurious noise, therefore degrading the testing accuracy. The proximity of the electronics to the DUT also influences the measurement accuracy. Thus, in test and measurement situations involving an RF enclosure, there are often two competing design considerations:

Including more sophisticated electronic components within an RF enclosure allows more accurate and more comprehensive test procedures to be executed. However from the point of view of RF isolation and noise reduction, fewer electronics components create smaller amounts of spurious RF energy that leads to improved RF measurements. These competing considerations must both be addressed when designing RF test and measurement systems that incorporate RF enclosures.

A further issue when electronics components are used within an RF enclosure is the complexity of the interface between the electronics inside the RF enclosure and the electronics outside the RF enclosure. As the number of communication paths that cross the RF interface increase, so does the amount of RF noise generated by each path. Thus, a secondary design consideration is the method of controlling the electronics path across an RF barrier of an RF enclosure.

There are many different methods of controlling electronics across an RF barrier of an RF enclosure. The RF enclosure may be used to test and prototype electronics devices, such as cell phones, personal digital assistants (PDAs), and other similar electronics. Most methods of controlling electronics across an RF barrier use electrical signals propagating through a filtered connector as the primary transport mechanism. These electrical signals can carry data reads and data writes to and from the electronics within an RF enclosure. Most of these methods may be classified into one of three basic types: direct drive, wide parallel, and command serial.

A direct drive control method consists of providing dedicated electrical resources outside of the RF enclosure that pass through the filtered connector(s) for each element being controlled. An example of this type of control method would be to generate relay coil drive signals outside the RF cavity and pass each of these drive lines through the filtered connectors to relays inside the cavity. This method requires an individual control line that passes through the filtered connector for each resource being controlled. It is desirable to limit the number of control lines passing through the filtered connectors since these filtered connectors are very expensive (approximately $2.00/line) and the effective RF isolation of the structure degrades with the number of signals passing through the filtered connectors. A direct drive scheme is also not very flexible or expandable.

A wide parallel control method consists of a conventional address, data, and control scheme in which all signals must pass through the filtered connectors(s) to register based electronics inside the RF cavity. This method often requires a large number of signals passing through the filtered connectors. A typical implementation might consist of 16 or more lines: 8 data, 5 address, and 3 control. Many RF test fixtures such as the TS-50 (Yukon) and the Z2030A (Osprey) use this control method.

A command serial control method consists of sending commands across the filtered connector(s) to a microprocessor or other programmable logic device that can interpret these commands into control sequences. This method commonly requires a clock to be running at all times inside the RF enclosed portion for clocking the microprocessor or logic device. This clock creates spurious noise that can interfere with the measurements inside the RF cavity. Command serial control methods are also more complicated and often require some firmware programming.

Other methods of control across an RF barrier exist that do not use an electrical connection. An example of this is an optical link. These methods tend to be more expensive and require a free running clock that adds to the electrical noise inside the RF cavity.

Thus, there is an unmet need in the art for a simple, cost effective method of controlling electronics across an RF barrier. Such a method should provide an ideal environment for test RF devices, have good RF isolation, encompass a less expensive design with fewer lines and built-in interfaces, have low spurious noise, be simple to implement, and be flexible and extensible to future enhancements.

SUMMARY OF THE INVENTION

The present invention takes advantage of the industry standard serial data control buses capable of serially shifting data in and/or out of electronics being controlled in some pre-determined protocol to provide a serial data control protocol for controlling electronics across an RF barrier. A microprocessor with a built-in serial data control bus (e.g., SPI) exists outside of the RF chamber. An address dependent form of the serial bus passes through one or more RF filtered connectors into the RF cavity. The processor uses the serial data bus to control (data reads and data writes) an arbitrary amount of electronics inside and outside of the RF cavity. This control method requires a minimal number of signals passing through the filtered connectors, preserving the RF isolation of the cavity from the external environment.

The addressing scheme is designed to specifically isolate electronics outside the RF chamber from the electronics inside the chamber. The serial data bus lines that pass through into the RF cavity are held in a quiescent state unless being used to control electronics inside the RF cavity. This signal isolation technique provides a very low spurious noise environment inside the RF cavity. This is important for sensitive RF measurements, while allowing the processor to control external electronics. This gating functionality may additionally have a temporal aspect that controls when individual signals are gated from entering the RF cavity. This provides the important advantage of being able to selectively control noise levels experienced during the testing process.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

FIG. 2 is a sample addressing scheme, according to an embodiment of the present invention.

DETAILED DESCRIPTION OF THE INVENTION

Figure 1:
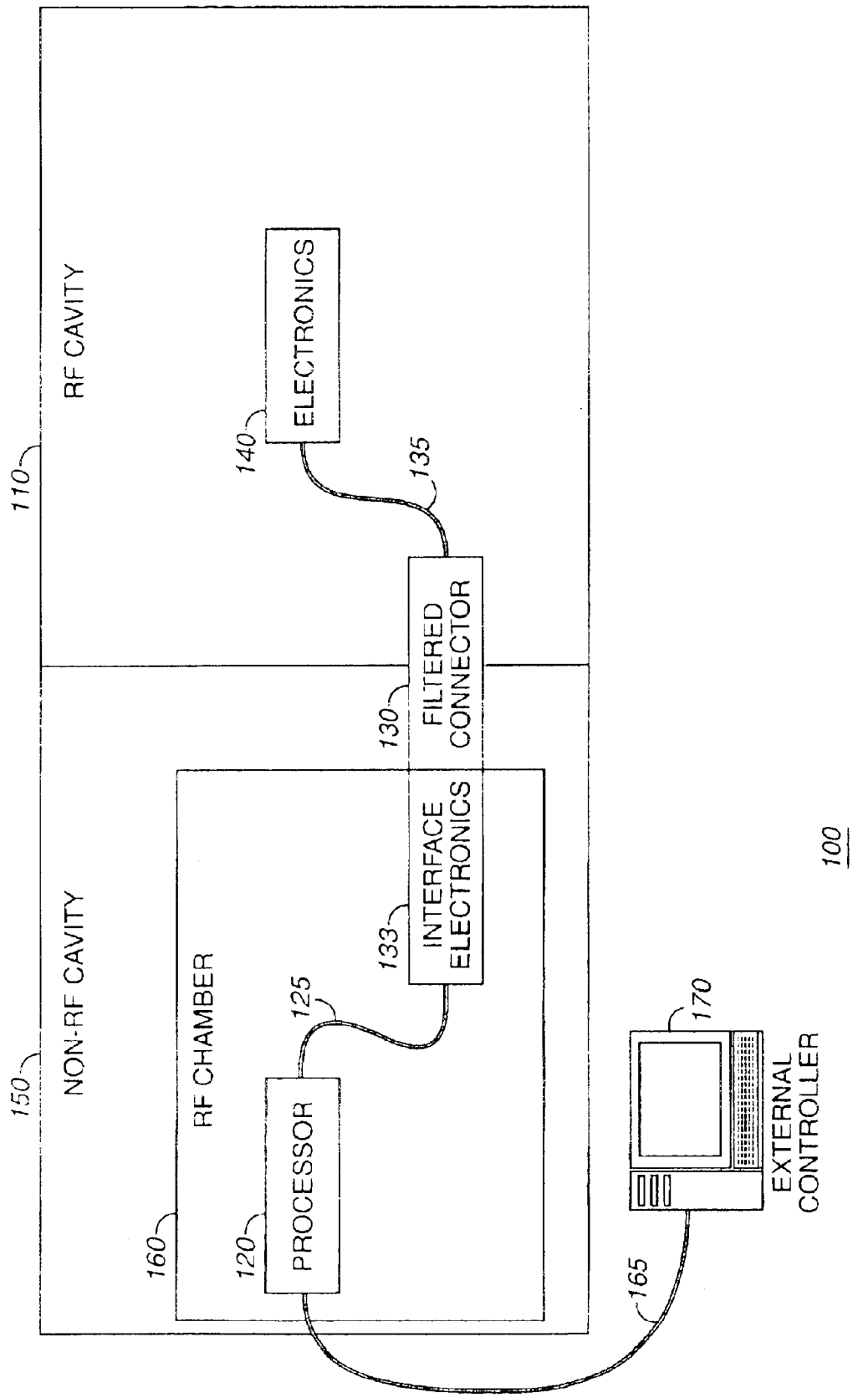
FIG. 1 is a block diagram of an RF cavity and the associated control elements, according to an embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

A number of industry standard serial data control buses exist for controlling electronics using a limited number of electrical lines. These buses serially shift data in and/or out of electronics being controlled in some pre-determined protocol. These buses commonly require a clock line, data line, and possibly one or more control lines. Such control lines may be used for operations such as chip select and chip reset, depending upon the exact bus implementation. Examples of these protocols include Microwire, I2C, SPI, and JTAG Boundary Scan (IEEE1149.1). Industry standard buses are commonly available on many different types of electronics including microprocessors, Digital-to-Analog Converters (DACs), Analog-to-Digital Converters (ADCs), memories, and register-based control devices.

The present invention is able to use these serial data control buses to provide a serial data control protocol for controlling electronics across an RF barrier. A microprocessor with a built-in serial data control bus (e.g., SPI) exists outside of the RF chamber. An address dependent form of the serial bus passes through one or more RF filtered connectors into the RF cavity. The processor uses the serial data bus to control (data reads and data writes) an arbitrary amount of electronics inside and outside of the RF cavity. This control method requires a minimal number of signals passing through the filtered connectors, preserving the RF isolation of the cavity from the external environment.

Referring to block diagram 100 of FIG. 1, an embodiment of the present invention is shown. Processor 120 is coupled to interface electronics 133 via a serial data control bus cable 125. A non-RF cavity 150 is used to house the processor 120 and the electronics outside the RF chamber 160. An external controller 170, such as a personal computer (PC), uses a number of external interfaces 165, either serial or parallel, e.g. RS232, to control the processor 120. Interface electronics 133 is operable to choose one or more of a plethora of input signals. The selected input signals are coupled to filtered connector 130. Filtered connector 130 is coupled to electronics 140 within RF cavity 110 by serial data control bus cable 135, which may be physically realized as one or more cables or printed circuit assemblies. Processor 120 is operable to transmit and receive one or more data signals using serial data control bus cable 125 to filtered connector 130. Filtered connector 130 isolates these one or more data signals and passes them to electronics 140 via serial data control bus cable 135. An addressing scheme is implemented by processor 120 so that only those serial bus lines that are used to control electronics 140 within RF cavity 110 are active. The selection of the one or more serial lines operable to enter RF cavity 110 is controlled by interface electronics 133. The use of a gating functionality to determine which signals are permitted to enter RF cavity 110 may additionally have a temporal aspect in that it may be used to selectively determine when such signals are permitted to enter RF cavity 110. This temporal aspect is an important advantage of the present invention. There may be times during the testing process when eliminating spurious noise is not important but other times, such as during noise sensitive measurements, which it can be critical.

Referring now to FIG. 2, an example of this addressing scheme is shown according to one embodiment of the present invention. This example uses eight addresses to control electronics internal and external to the RF cavity. Addresses 0, 1, 2, and 3 are operable to control one or more electronics elements within electronics 140. Addresses 4, 5, 6, and 7 are operable to control one or more elements within electronics outside the RF chamber 160. In this example address line #1 is used to gate all signals that enter RF cavity 110. Thus only addresses 0, 1, 2, and 3 are active within the RF cavity. This gating functionality, enabled through setting the value of line #1, allows a processor element to allow only those signals used to control electronics 140 enter the RF cavity. Those signals corresponding to addresses 4, 5, 6, and 7 are held in a quiescent mode within the RF cavity. Again, the gating functionality may have a temporal characteristic in that interface electronics 133 can through the gating control when certain signals are allowed to enter RF cavity 110.

Those of ordinary skill in the art will recognize that the present invention has been described in terms of exemplary embodiments. It should be apparent to one of skill in the art that the number of addresses and the method of gating the addresses may differ from that presented in FIG. 2. For example, 32 addresses could be used, with 24 applied to components within the cavity and 8 applied to components external to the cavity. In a preferred embodiment of the present invention, integrated circuit technology is used to provide the quiescent gating function that allows only certain signals to enter the RF cavity. This gating function may have a selective temporal quality that determines when these certain signals are permitted to enter the RF cavity. It should also be apparent to one of skill in the art that many different types of serial data control buses could be implemented without departing from the spirit and scope of the present invention. Microwire, I2C, SPI, and IEEE1149.1 are some examples of applicable serial data control buses. According to the preferred embodiment of the present invention, SPI is used as the serial data control bus.

It should also be apparent to one or skill in the art that interface electronics 133 is operable to be coupled directly to processor 120 without departing from the spirit and scope of the present invention. Further, electronics component 140 may be distributed in several locations within RF enclosure 110. Filtered connector 130 is operable to maintain connections with one or more of these distributed electronics components.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method of controlling a flow of serial data across an Radio Frequency (RF) barrier of an RF enclosure, comprising:

a processor sending one or more control data using one or more lines of a serial control data bus;

an interface electronics module, receiving the one or more lines of the serial control data bus and selecting one or more signals corresponding to one or more addresses of the one or more lines; and the interface electronics module, sending the selected one or more signals across the RF barrier to an electronics module within the RF enclosure, wherein the RF enclosure is operable to facilitate testing of devices placed inside the RF enclosure.

2. The method of claim 1, wherein selecting the one or more signals further comprises selecting each signal with a same line value.

3. The method of claim 1, wherein the processor is a microprocessor.

4. The method of claim 1, wherein integrated circuit technology is used to select the one or more signals.

5. The method of claim 1, wherein the serial control data bus is an SPI bus.

6. The method of claim 1, wherein the one or more signals are selected by the processor.

7. The method of claim 1, wherein the interface electronics module further comprises an RF filtered connector.

8. The method of claim 7, wherein one or more Schmitt trigger input buffers are used to eliminate potential noise problems caused by the RF filtered connectors.

9. The method of claim 1, wherein sending the selected one or more signals to the electronics module within the RF enclosure is performed in accordance with a gating functionality of the interface electronics module.

10. The method of claim 9, wherein the gating functionality is a temporal gating functionality.

11. A structure for controlling a flow of serial data across an Radio Frequency (RF) barrier of an RF enclosure, comprising:

a processor, operable to send and receive data, coupled to one or more lines of a serial control data bus;

an interface electronics module, operable to select one or more signals corresponding to one or more addresses of the one or more lines of the serial control data bus, said RF interface module coupled to an RF enclosure and wherein the RF enclosure is operable to facilitate testing of devices placed inside the RF enclosure; and an electronics module physically located within the RF cavity, operable to receive the one or more lines selected by the interface electronics module, said electronics module coupled to the interface electronics module.

12. The structure of claim 11, wherein the interface electronics module selects each signal with a same line number.

13. The structure of claim 11, wherein the processor is a microprocessor.

14. The structure of claim 11, wherein integrated circuit technology is used to select the one or more signals.

15. The structure of claim 11, wherein the serial control data bus is an SPI bus.

16. The structure of claim 11, wherein the one or more signals are selected by the processor.

17. The structure of claim 11, wherein an RF filtered connector is coupled to the interface electronics module and to the RF enclosure, said RF enclosure providing an interface to the RF cavity.

18. The structure of claim 17, wherein one or more Schmitt trigger input buffers are used to eliminate potential noise problems caused by the RF filtered connectors.

* * * * *